United States Patent
Molla et al.

(10) Patent No.: US 6,625,560 B1
(45) Date of Patent: Sep. 23, 2003

(54) METHOD OF TESTING SERIAL INTERFACE

(75) Inventors: Ziaus S. Molla, Santa Clara, CA (US); Victor DaCosta, Santa Cruz, CA (US); Seung Ho Hwang, Palo Alto, CA (US); Baegin Sung, Sunnyvale, CA (US)

(73) Assignee: Silicon Image, Inc., Sunnyvale, CA (US)

( * ) Notice: Subject to any disclaimer, the term of this patent is extended or adjusted under 35 U.S.C. 154(b) by 122 days.

(21) Appl. No.: 09/904,783

(22) Filed: Jul. 13, 2001

(51) Int. Cl.[7] ................................................. G06F 11/00
(52) U.S. Cl. ........................ 702/120; 702/125; 714/731; 714/814
(58) Field of Search .............................. 702/120, 69, 71, 702/72, 75, 78, 79, 106, 107, 122, 124–126, 189, 176–178, FOR 103, FOR 106, FOR 107, FOR 109, FOR 110, FOR 134, FOR 170, FOR 171, 117; 714/704, 700, 814, 815, 724, 731, 819, 744, 715, 821; 713/501, 503; 375/224, 226, 371; 370/241

(56) References Cited

U.S. PATENT DOCUMENTS

| | | | | |
|---|---|---|---|---|
| 5,309,428 A | * | 5/1994 | Copley et al. | 370/245 |
| 5,835,501 A | * | 11/1998 | Dalmia et al. | 714/704 |
| 6,076,175 A | * | 6/2000 | Drost et al. | 714/704 |
| 6,385,236 B1 | * | 5/2002 | Chen | 375/224 |

* cited by examiner

*Primary Examiner*—Hal Wachsman
(74) *Attorney, Agent, or Firm*—Girard & Equitz LLP

(57) ABSTRACT

A method of testing a circuit having an interface which includes data and clock information where phase jitter is introduced into the clock that produces the clock information. The clock is cycled by increasing the period of the clock for a predetermined number of clock cycles so as to introduce an increasing phase shift advance in the clock. The clock is also cycled by decreasing the period of the clock for a predetermined number of clock cycles so as to introduce an increasing phase shift delay in the clock. The circuit under test is caused to sample the data using a clock derived from the clock information. The sampled data is then compared with reference data to determine the error rate.

15 Claims, 4 Drawing Sheets

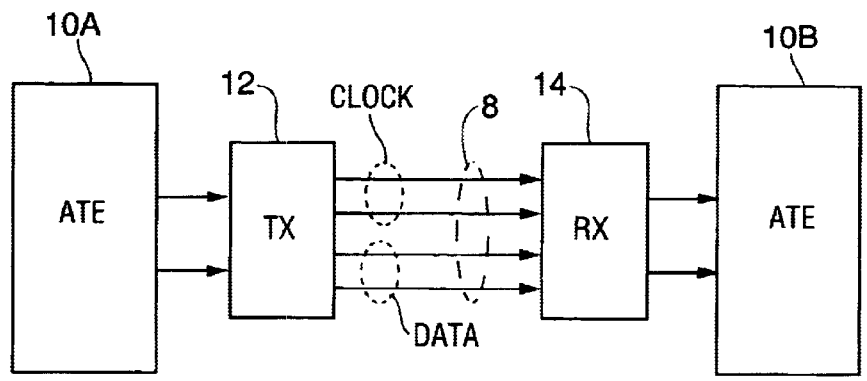
FIG. 1A
(PRIOR ART)
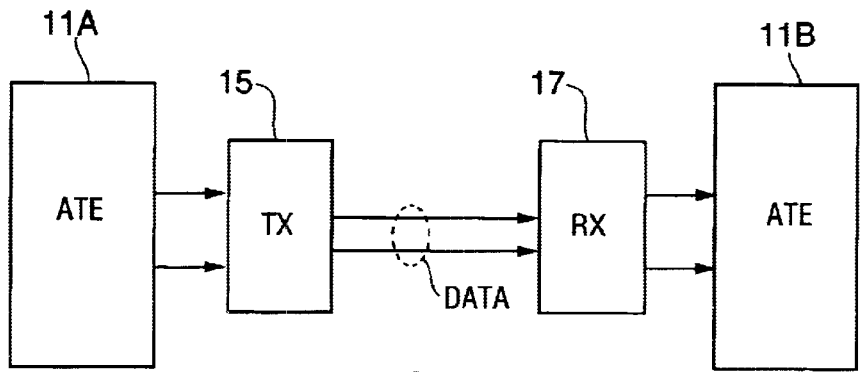
FIG. 1B
(PRIOR ART)
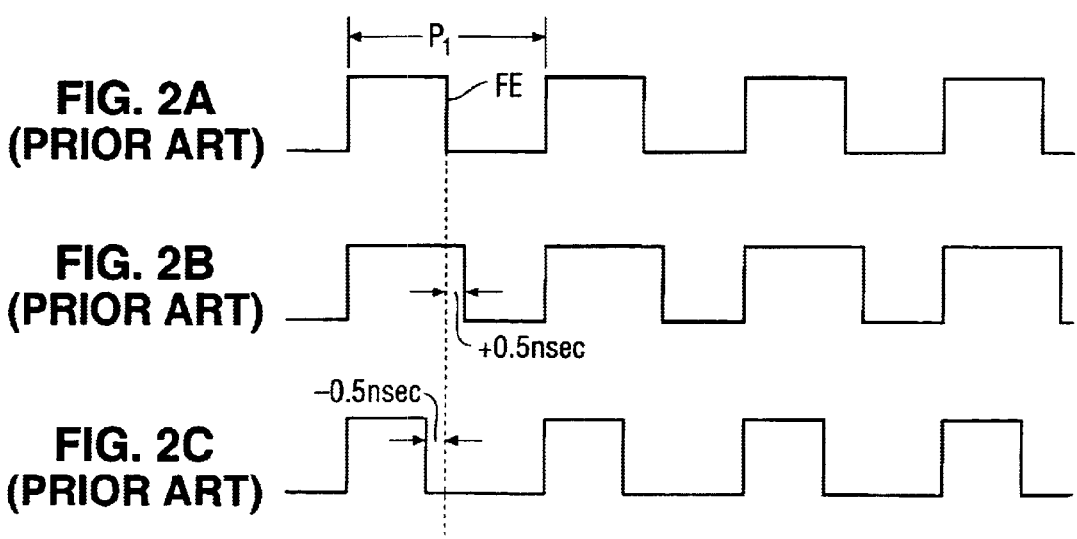
FIG. 2A
(PRIOR ART)
FIG. 2B
(PRIOR ART)
FIG. 2C
(PRIOR ART)

METHOD OF TESTING SERIAL INTERFACE

BACKGROUND OF THE INVENTION

1. Field of the Invention

The present invention relates generally to the field of circuit testing and, in particular, to a method for testing a serial interface.

2. Description of Related Art

Automated test equipment (ATE) is frequently used to test electrical circuits. FIG. 1A shows a typical conventional testing configuration using automated test equipment. Assume for example that an integrated circuit having a transmitter section (TX) 12 for driving a serial interface is to be tested. Typically, the transmitter section 12 is connected to an interface receiver section (RX) 14 by a short cable 8. The receiver section 14 is known to operate within specification and is thus sometimes referred to as a golden unit. The cable 8 includes at least one pair that carry a clock in differential form and at least one pair that carry data in differential form. Thus, the interface contains both data and clock information which are transmitted over separate lines. A clock derived from the clock information is used by the receiver section to sample the data information transmitted over the interface.

One section 10A of automated test equipment is located at the transmitter section 12 and is used to generate the data and the clock information to be transmitted over the interface. Another section 10B of automated test equipment is used to receive the detected data and compare the data with the data that was transmitted or some other form of reference data. If immunity to phase jitter is to be tested, the section 10A test equipment operates to introduce a specified amount of phase jitter into the clock used to produce the clock information. By way of example, the jitter specification may be 1 ns peak-to-peak jitter at a 1 MHz jitter frequency.

FIGS. 2A, 2B and 2C show a conventional technique of introducing phase jitter. FIG. 2A shows a signal, such as a clock, having a base period P1. Assume that a falling edge FE of the clock is used to clock or sample data received over an interface together with the clock. In order to simulate phase jitter, the falling edge of the clock is first advanced a fixed amount in time, +0.5 ns for example, as shown in FIG. 2B. Next, as can be seen in FIG. 2C, the falling edge of the clock is then retarded a fixed amount in time, −0.5 ns for example. Typically, the falling edge is advanced in increments to reach the +0.5 ns point and then is incrementally returned to the original position. The clock is then retarded in increments to reach the −0.5 nanosecond point and then incrementally returned to the original position so that one complete cycle of 1 nanosecond of peak-to-peak jitter is produced.

Rather than having separate data and clock lines as shown in FIG. 1A, it is possible to recover the clock from the data channel. In that event, only the modulated data need be transmitted as shown in FIG. 1B. Thus, both data and clock information are transmitted over the interface on common lines. Again, the above-described technique is used to introduce phase jitter onto the clock used to modulate the data to be transmitted by a transmitter section 15. Well known circuitry is present at the receiver section 17 to recover the clock and to demodulate the received signal to obtain the data.

The prior art method of testing described above does posses certain shortcomings. First, this approach is limited with respect to the magnitude of the amount of phase jitter that can be introduced. The falling edge FE (FIG. 2B) can only be shifted a time period which corresponds to ±180 degrees. Further, such approach is not easily implemented using automated test equipment.

The present invention overcomes the above-noted limitations of the prior art. The magnitude of the phase jitter that can be introduced is essentially unlimited. Further, the method can be readily implemented using automated test equipment. These and other advantages of the present invention will become apparent to those skilled in the art upon a reading of the following Detailed Description of the Invention together with the drawings.

SUMMARY OF THE INVENTION

A method of testing a circuit having an interface over which data and clock information are transmitted and where the data information is sampled using a clock derived from the clock information so as to produce sampled data is disclosed. Phase jitter is introduced on the clock which produces the clock information by increasing the period of the clock from a base period by a first increment period for a first predetermined number of clock cycles. By way of example, if the first increment period is 0.0625 ns and the first predetermined number of clock cycles is sixteen, the total phase shift will increase by 1 ns (16×0.0625 ns). The clock is also cycled by decreasing the period of the clock from the base period by a second increment period for a second predetermined number of clock cycles. As a further example, if the second increment period is 0.0625 ns and the second predetermined number of clock cycles is sixteen, the total phase shift will decrease by 1 ns. Preferably, the first and second predetermined number of clock cycles are both at least two.

As the clock is cycled though the first and second time periods, the circuit being tested is caused to sample the data using the clock derived from the clock information. The sampled data is then compared with reference data to determine if any errors occurred.

BREIF DESCRIPTION OF THE DRAWINGS

FIGS. 1A and 1B are diagrams of conventional testing configuration using automated test equipment.

FIGS. 2A is a clock waveform, with FIGS. 2B and 2C showing the clock waveform with phase jitter introduced by adjusting the time at which the falling edge of the clock occurs.

DETAILED DESCRIPTION OF THE INVENTION

Figure 3A:
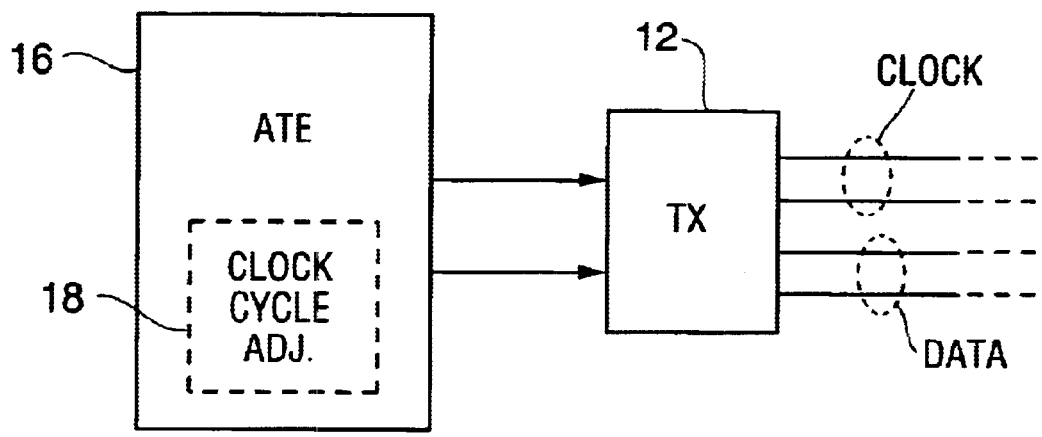
FIGS. 3A and 3B depict parts of a modified test configuration which permits the clock cycle period of the clock generated by the automated test equipment to be controlled in accordance with the present invention.
Figure 3B:
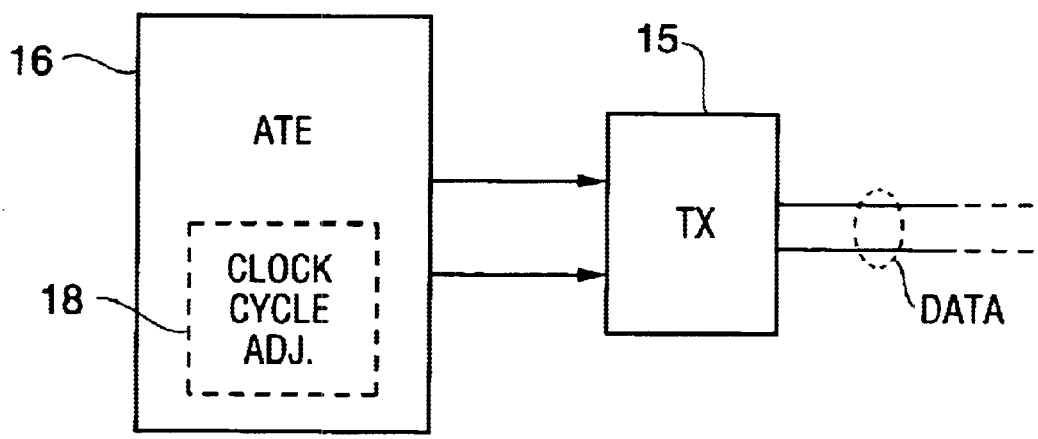

Referring again to the drawings, block 16 of FIG. 3A represents a section of automated test equipment (ATE) in a test configuration similar to that of FIG. 1A in the case where the data and clock are transmitted separately. In other words, he data and clock information are transmitted over separate lines. FIG. 3B shows the case where only the data are transmitted, with the clock being recovered from the received data as noted previously in connection with FIG. 1B. Thus, the data and clock information are transmitted over the same lines.

As used herein, the circuit being tested includes both the transmitter section 12 of FIG. 1A (section 15 of FIG. 1B) and the receiver section 14 of FIG. 1A (section 17 of FIG.

1B) even though one of the sections may be a reference or so-called golden unit. Also, if transceiver circuits are to be tested, there is typically some circuitry that performs only the receiver or only the transmitter function and some circuitry that contributes to both functions. As used herein, that portion of the transceiver that performs and contributes to the receiver function is considered to be a receiver section and that portion of the transceiver that performs and contributes to the transmitter function is considered herein to be a transmitter section.

Figure 4:
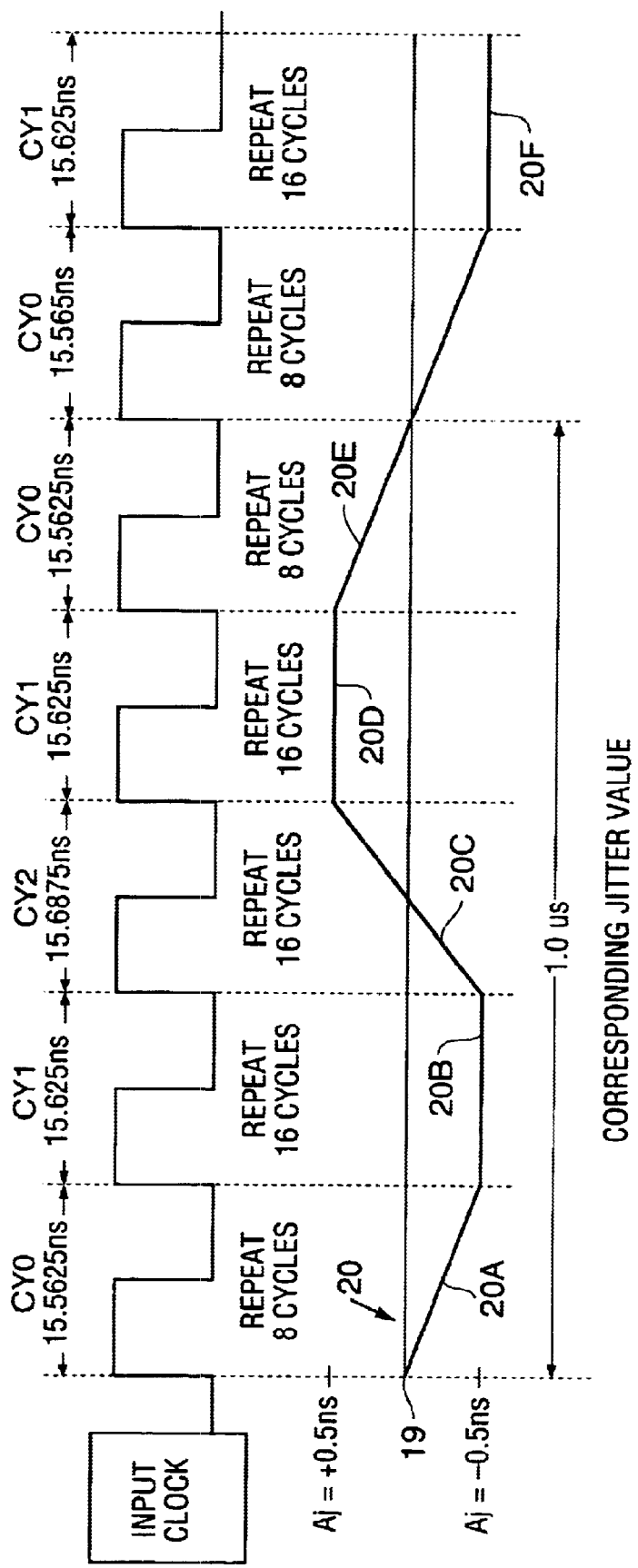
FIG. 4 is a timing diagram illustrating one example of the manner in which the phase jitter of the clock produced by the automated test equipment can be controlled in accordance with the present invention.

The period or cycle of the clock controlled by ATE 16 can be adjusted in discrete steps as represented by element 18. FIG. 4 illustrates the manner in which the clock cycle can be adjusted in connection with either the FIG. 3A or the FIG. 3B embodiment so as to introduce a controlled amount of phase jitter over a wide range of amplitudes and a wide range of frequencies. (Note that FIG. 4 timing diagrams are not drawn to scale.) A clock is produced having a period of 15.625 ns (64 MHz). This is some times referred to as the base period. The phase jitter having a peak-to-peak magnitude of 1.0 ns and a frequency of 1.0 MHz is introduced by adjusting the clock period in predetermined increments. In the present example, the size of the increments or steps is 62.5 ps.

Initially, at point 19 of waveform 20 of FIG. 4, the clock period is 15.625 ns, a value which represents no jitter. As will be seen, at this point, the clock is transitioning from having a positive phase shift to a negative phase shift. The clock cycle adjust feature 18 of ATE 16 (FIG. 3A) is programmed to decease the clock period by 62.5 ps for eight cycles, with each cycle thus having a period of 15.5625 ns. The eight cycles occur in time period CY0. Each cycle introduces a phase shift Aj of 62.5 ps so that the total phase shift Aj at the end of the eight cycles is −0.5 ns (8×62.5 ps). Section 20A of waveform 20 illustrates the linear decrease in phase shift.

The clock phase remains constant at −0.5 ns during time period CY1 as represented by section 20B of waveform 20. This is accomplished by returning the clock period back to the base period of 15.625 ns so that no change in phase occurs. In the present example, a total of sixteen cycles at 15.625 ns each are produced.

At the beginning of time period CY2, the clock period is increased to 15.6875 ns so as to create a phase increase. A total of sixteen clock cycles, each having a period of 15.6875 ns, are produced during period CY2 so that the phase will increase a total of 1.0 ns (16×0.0625 ns). Thus, as represented by section 20C of waveform 20, the phase shift Aj will change from −0.5 ns to +0.5 ns.

The phase shift of +0.5 ns is maintained during a subsequent period CY1 by returning the clock period back to the base period of 15.625 ns. The constant value of Aj is represented by section 20D of waveform 20. The phase shift Aj is then reduced from +0.5 ns to 0 during cycle period CY0 by reducing the period to 15.5625 ns for eight cycles and is further reduced from 0 to −0.5 ns during cycle period CY1 to for an additional eight cycles. Thus, phase jitter having the desired peak-to-peak magnitude of 1.0 ns at a frequency of 1.0 MHz is produced by selectively adjusting the clock period in predetermined increments and at a predetermined rate. It is apparent that the magnitude and frequency of the phase jitter can be readily altered by changing the manner in which the clock cycle adjust 18 is implemented, typically by way of ATE programming.

During the periods where phase jitter is introduced into the clock, a clock at the receiver section derived from the clock information on the interface is used to sample data provided at the data interface. The sampled data is then compared with the reference data to determine whether the phase jitter has produced an error. In the FIG. 4 example, the number of clock cycles for changing the phase shift from −0.5 ns to +0.5 ns is sixteen, including sixteen cycles of 15.6875 ns and sixteen cycles of 15.5625 ns. Preferably, at least two cycles are used for changing the phase shift between the maximum and minimum value.

Figure 5:
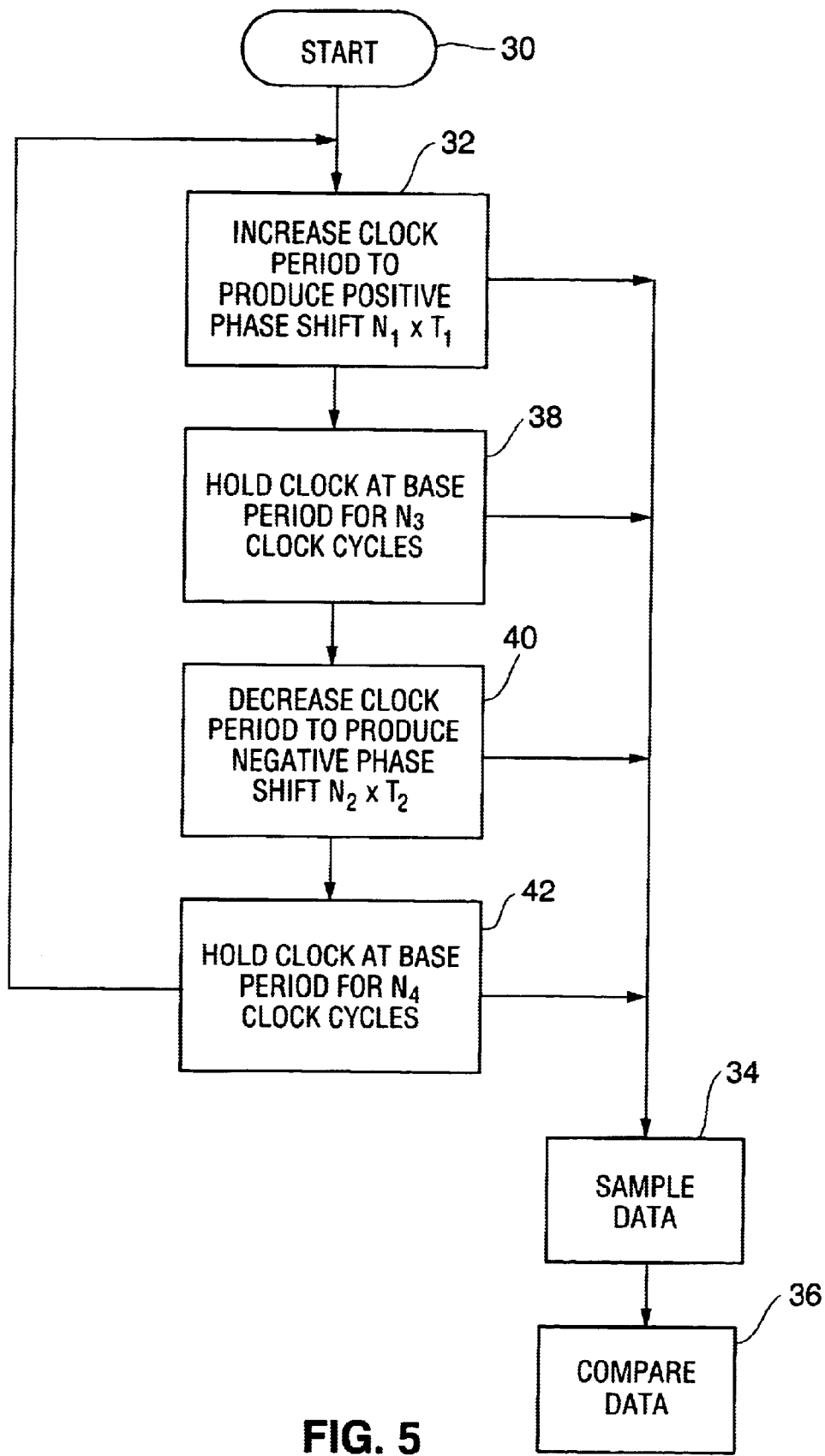
FIG. 5 is a flow chart depicting an exemplary embodiment of the present invention.

The foregoing can be further illustrated in reference to the flow chart of FIG. 5. The sequence begins, by way of example, at the end of time period CY1 shown in FIG. 4 when the accumulated phase shift Aj is −0.5 ns, that is, at the time indicated by the end of section 20B of line 20. This is represented by element 30 of the FIG. 5 flow chart. The clock period is then increased by 62.5 ps for a total of 16 clock cycles during time period CY2 as indicated by section 20C of line 20. Assuming the time increment increase is T1 and the number of clock cycles is N1, a positive phase shift corresponding to the product of T1 and N1 (62.5 ps×16=1.0 ns) will be introduced as indicated by element 32 of FIG. 5. The increase in phase shift will result in an accumulated shift Aj that corresponds to +0.5 ns as shown in FIG. 4. Preferably, during this period CY2, the recovered clock is used to sample the data on the communication interface as shown by element 34 and the recovered data is compared to the reference data, as shown by element 36, to determine if the phase jitter just introduced has caused an error.

Next, the frequency of the clock is returned to the base period for N3 or 16 number of clock periods as shown by element 38 and as represented by section 20D of FIG. 4. Thus, the accumulated phase shift Aj of +0.5 ns will remain constant during this period. As indicated by elements 34 and 36, the data is sampled during this period CY1 and compared for errors. The clock period is then reduced from the base period by the time increment of 62.5 ps per cycle for a total of 16 cycles as indicated by section 20E of line 20 of FIG. 4. Assuming the time increment decrease is T2 and the number of clock cycles is N2, a negative phase shift corresponding to the product of T2 and N2 (62.5 ps×16=1.0 ns) will be introduced as indicated by element 40 of FIG. 5. The decrease in phase shift will result in an accumulated shift Aj that corresponds to −0.5 ns as shown in FIG. 4. Again, the recovered-clock is used to sample the data on the communication interface as shown by element 34 and the recovered data is compared to the reference data, as shown by element 36, to determine if the phase jitter just introduced has caused an error.

Continuing, the clock period is returned to the base period for 16, or N4, number of clock cycles so that the accumulated jitter Aj will remain constant at −0.5 ns during the period represented by section 20F of line 20. Again, data is sampled and compared during this period CY1. The operation then returns to element 32 of FIG. 5 repeating the testing sequence as required.

As previously noted, the FIG. 3B embodiment is used where the data and clock information are transmitted on over the interface on common lines. The clock adjust feature 18 is controlled in the same manner as previously described in connection with the FIG. 3A embodiment. Thus, the clock that is recovered at the receiver will contain phase jitter as a result of the jitter introduced by the clock adjust feature 18. The data which is detected using the recovered clock is compared with the transmitted data or some other reference data as was the case of the FIG. 3A embodiment.

Thus, a novel method of testing a circuit has been disclosed which can easily be implemented using automated test equipment. Although various embodiments have been described in some detail, it is to be understood that certain changes can be made by those skilled in the art without departing from the spirit and scope of the present invention as defined by the appended claims.

What is claimed is:

1. A method of testing a circuit which includes a transmitter section that transmits data information derived from a data source and clock information derived from a clock source over a communication interface to a receiver section, with the receiver section deriving a decoding clock from the clock information which is used to recover data from the data information, said method comprising:

cycling a transmit clock produced by the clock source by increasing a period of the transmit clock for a first predetermined number of clock cycles, where the first predetermined number of clock cycles is at least two, and by decreasing the transmit clock period a second predetermined number of clock cycles, where the second predetermined number of clock cycles is at least two;

sampling the data using the decoding clock during the cycling to produce sampled data; and comparing the sampled data with reference data relating to data of the data source.

2. The method of claim 1 wherein the clock information and the data information are transmitted over separate lines on the communication interface.

3. The method of claim 1 wherein the clock information and the data information are transmitted over common lines on the communication interface.

4. The method of claim 1 wherein the transmit clock has a base period and wherein during the cycling, the period is increased from the base period by a first increment period for the first predetermined number of clock cycles and the period is decreased from the base period by a second increment period for the second predetermined number of clock cycles.

5. The method of claim 4 wherein the first and second increment periods are of an equal duration.

6. The method of claim 4 wherein a positive phase shift is introduced in the transmit clock at an end of the first predetermined number of clock cycles which corresponds to N1×T1, where N1 is the first predetermined number of clock cycles and T1 is the first increment period and a negative phase shift is introduced at an end of the second predetermined number of clock cycles which corresponds to N2×T2, where N2 is the second predetermined number of clock cycles and T2 is the second increment period.

7. The method of claim 6 wherein subsequent to the increasing the period and prior to the decreasing the period, the period of the transmit clock is held at the base period for N3 number of clock cycles so that no additional phase shift is introduced during the N3 number of clock cycles.

8. The method of claim 7 wherein subsequent to the decreasing the period and prior to the increasing the period, the period of the transmit clock is held at the base period for N4 number of clock cycles so that no additional phase shift is introduced during the N4 number of clock cycles.

9. The method of claim 8 wherein N3 and N4 are the same.

10. A method of testing a circuit which includes a transmitter section which transmits data information derived from a data source and clock information derived from a clock source over a communication interface to a receiver section, with the receiver section deriving a decoding clock from the clock information which is used to recover data from the data information, said method comprising:

cycling a transmit clock produced by the clock source by increasing a period of the transmit clock for a first predetermined number of clock cycles so that a positive phase shift is introduced during the increasing which corresponds to a specified peak-to-peak magnitude and by decreasing the period of the transmit clock for a second predetermined number of clock cycles so that a negative phase shift is introduced during the decreasing which corresponds to a specified peak-to-peak magnitude, with a time period where the increasing begins to where the decreasing ends corresponds to the specified frequency of the phase jitter and where the first and second predetermined number of clock cycles are both at least two; and sampling the data using the decoding clock during the cycling so as to produce sampled data; and comparing the sampled data with reference data related to data of the data source.

11. The method of claim 10 wherein the cycling includes maintaining the period of the transmit clock at a base period for a third predetermined number of clock cycles subsequent to the increasing and prior to the decreasing so that no additional phase shift is introduced during the third predetermined number of clock cycles.

12. The method of claim 11 wherein the cycling includes maintaining the period of the transmit clock at the base period for a fourth predetermined number of clock cycles subsequent to the decreasing and prior to the increasing so that no additional phase shift is introduced during the fourth predetermined number of clock cycles.

13. The method of claim 12 wherein the first and second predetermined number of clock cycles are the same and the third and fourth predetermined number of clock cycles are the same.

14. A method of testing a circuit which produces a clock having a base period and which samples data using the clock, said method comprising:

increasing the clock period from the base period by a first increment period T1 for N1 number of clock cycles so that at an end of the N1 number of clock cycles a positive phase shift is introduced which corresponds to N1×T1, where N1 is at least two;

decreasing the clock period from the base period by a second increment period T2 for N2 number of clock periods so that at an end of the N2 number of clock cycles a negative phase shift is introduced which corresponds to N2×T2, where N2 is at least two;

repeating the increasing and decreasing;

sampling the data using the clock during the increasing and decreasing so as to produce sampled data; and testing the sampled data to identify any errors produced by the increasing and decreasing of the clock period.

15. The method of claim 14 wherein intermediate the increasing and decreasing, the clock is held at a base period for N3 number of clock cycles so that at an end of the N3 number of clock cycles no additional phase shift is introduced.

* * * * *